United States Patent
McCall et al.

(10) Patent No.: US 6,820,163 B1
(45) Date of Patent: *Nov. 16, 2004

(54) BUFFERING DATA TRANSFER BETWEEN A CHIPSET AND MEMORY MODULES

(75) Inventors: James A. McCall, Beaverton, OR (US); Randy M. Bonella, Portland, OR (US); John B. Halbert, Beaverton, OR (US); Jim M. Dodd, Shingle Springs, CA (US); Chung Lam, Redwood City, CA (US)

(73) Assignee: Intel Corporation, Santa Clara, CA (US)

( * ) Notice: Subject to any disclaimer, the term of this patent is extended or adjusted under 35 U.S.C. 154(b) by 373 days.

This patent is subject to a terminal disclaimer.

(21) Appl. No.: 09/666,489

(22) Filed: Sep. 18, 2000

(51) Int. Cl.[7] .......................... G06F 13/00; G06F 3/00; G06F 12/00
(52) U.S. Cl. .......................... 710/310; 711/105; 365/52
(58) Field of Search .................. 710/52, 310; 711/105; 365/51, 52

(56) References Cited

U.S. PATENT DOCUMENTS

| | | | |
|---|---|---|---|
| 5,572,691 A | | 11/1996 | Koudmani |
| 5,757,712 A | | 5/1998 | Nagel et al. |
| 5,768,624 A | | 6/1998 | Ghosh |
| 5,828,892 A | | 10/1998 | Mizuta |
| 5,926,838 A | | 7/1999 | Jeddeloh |
| 5,953,215 A | * | 9/1999 | Karabatsos .................. 365/51 |
| 6,345,321 B1 | | 2/2002 | Litaize et al. |
| 6,381,684 B1 | * | 4/2002 | Hronik et al. ............... 711/167 |
| 6,449,213 B1 | * | 9/2002 | Dodd et al. .................. 365/233 |
| 6,487,102 B1 | * | 11/2002 | Halbert et al. ................ 365/51 |
| 6,493,776 B1 | | 12/2002 | Courtright et al. |
| 6,502,161 B1 | | 12/2002 | Perego et al. |
| 6,553,450 B1 | | 4/2003 | Dodd et al. |
| 6,697,888 B1 | * | 2/2004 | Halbert et al. ................ 710/52 |
| 6,742,098 B1 | * | 5/2004 | Halbert et al. ............... 711/172 |
| 2001/0052057 A1 | | 12/2001 | Lai et al. |

FOREIGN PATENT DOCUMENTS

| EP | 0691617 | 1/1996 |
|---|---|---|
| JP | 2000231784 | 8/2000 |
| WO | WO 99/30240 | 7/1999 |

OTHER PUBLICATIONS

Cover Sheet, FIGS. 20A and 20B, and Cols. 41–44 of US Patent No. 6,345,321 to Litaize, et al.

* cited by examiner

*Primary Examiner*—Glenn A. Auve
(74) *Attorney, Agent, or Firm*—Fish & Richardson P.C.

(57) ABSTRACT

Buffering data transfer between a chipset and memory modules is disclosed. The disclosure includes providing and configuring at least one buffer. The buffers are provided in an interface between a chipset and memory modules. The buffers allow the interface to be split into first and second sub-interfaces. The first sub-interface is between the chipset and the at least one buffer. The second sub-interface is between the at least one buffer and the memory modules. The buffers are then configured to properly latch the data being transferred between the chipset and the memory modules. The first and second sub-interfaces operate independently but in synchronization with each other.

21 Claims, 5 Drawing Sheets

BUFFERING DATA TRANSFER BETWEEN A CHIPSET AND MEMORY MODULES

BACKGROUND

The present disclosure relates to providing data buffers in an interface between a chipset and memory modules.

Computer systems often contain one or more integrated circuit (IC) chips that are coupled to memory modules using a memory interface. These IC chips may be controllers referred to as chipsets. The memory interface provides communication between the IC chipset (e.g. the CPU) and the memory modules. The memory interface may contain address bus lines, command signal lines, and data bus lines. Increasing demand for higher computer performance and capacity has resulted in a demand for a larger and faster memory. However, as the operating speed and the number of memory modules connected to the chipset increase, the increased capacitive loading may place substantial limit on the amount and speed of memory.

Prior art designs, such as a registered dual in-line memory module (DIMM), have addressed the above-described difficulties by providing an address/command buffer in the address bus lines and the command signal lines to relieve the capacitive loading effects. Karabatsos (U.S. Pat. No. 5,953,215) describes a loading relief design for the data bus lines by providing FET switches in the interface between the chipset and the memory modules.

BRIEF DESCRIPTION OF THE DRAWINGS

Different aspects of the disclosure will be described in reference to the accompanying drawings wherein.

DETAILED DESCRIPTION

Figure 1:
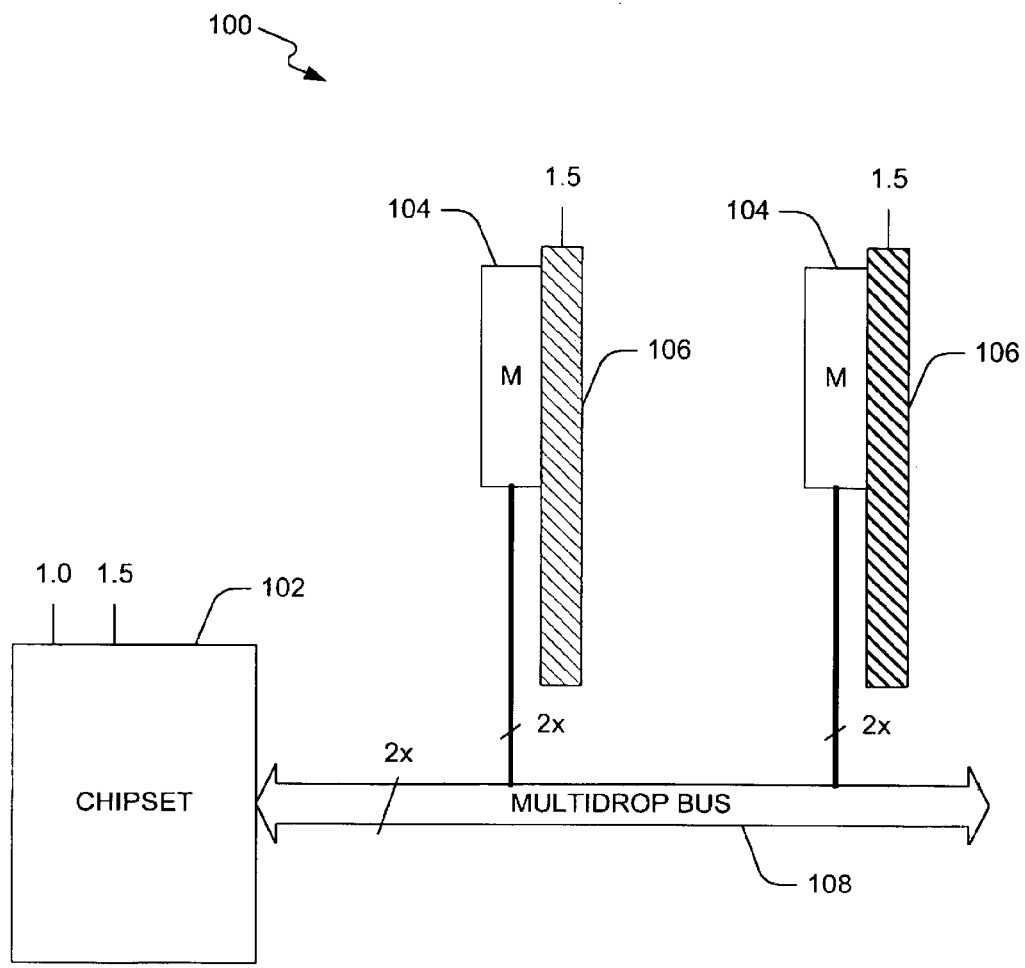
FIG. 1 shows a prior art design of an interface between a chipset and memory modules.

The inventors of the present disclosure recognized that none of the prior art designs offer isolation of supply voltages and interfaces coupled to the chipset and the memory modules. Buffering the address and command lines relieves the capacitive loading effects, while providing the FET switches in the data lines offers a loading relief on those lines. However, neither design provides electrical isolation between the chipset and the memory data.

The differences in fabrication process between the chipset and the memory modules place additional burdens on the computer system design. For example, oxides on a memory chip are designed to be thick to provide capacitors with good retention characteristic. Thick oxides also keep leakage current low. However, a higher voltage (on the order of about 1.2 to 1.8 volts) must be supplied to build conducting channels beneath the oxides. The Central Processing Unit (CPU) or application-specific integrated circuit (ASIC) design fabrication process on the chipset side, on the other hand, promotes thinner oxides providing faster transistors. Therefore, the chipset may be operated at a lower voltage, typically less than 1.0 volt.

The present disclosure describes methods and systems for buffering data transfer between a chipset and memory modules. The method includes providing and configuring at least one buffer provided in an interface between a chipset and memory modules. The buffer allows the interface to be split into first and second sub-interfaces. The first sub-interface is between the chipset and the buffer. The second sub-interface is between the buffer and the memory modules. The buffer is configured to latch the data being transferred between the chipset and the memory modules. The first and second sub-interfaces operate independently but synchronized with each other.

Buffering provides isolation of voltages and interfaces coupled to each of the chipset and the memory modules. The isolation of voltages allows the chipset to be operated with only a low operating voltage, which substantially precludes the need for the chipset to have a higher voltage common with a memory supply voltage. The memory module is then allowed to operate at voltages appropriate for its own operational purpose. The voltages may be independent of the operating voltage at the connecting system (chipset).

The isolation of the interfaces allows the inherently faster chipset interface to run at higher multiples of the memory interface rate. For example, the chipset to data buffer interface may run at twice the rate of the buffer to memory interface. This may allow the chipset to operate at twice the rate and access the same amount of data with half the number of data bus lines or pins. This provides computer system designers with a flexibility of utilizing a wider range of memory types and interfaces for a particular computer system. Further, by providing a data buffer on the memory module itself, the memory interface may be simplified by providing a short, fixed length stubs from the buffer to the memory module. In some configurations, the data buffer may be provided on the same motherboard as the chipset. An advantage provided by the electrical isolation that leads to the reduction in the number of pin count is illustrated in the design comparison between FIGS. 1 and 2.

In the prior art design 100 of FIG. 1, the interface 108 between the chipset 102 and the memory modules 104 is unbuffered. In some embodiments, the memory modules 104 may be individually mounted on memory boards 106 as shown. In other embodiments, the memory modules 104 may be soldered directly onto the same motherboard as the chipset 102.

In the prior art design 100, the chipset 102 is configured to receive two supply voltages, 1.0 volt (low) and 1.5 volts (high). The high voltage is necessary on the chipset side to provide compatible driving voltage on the memory interface 108. Further, the pin count on the chipset 102 may be designed to be 2×in order to provide a particular memory access rate or frequency, such as ω.

Figure 2:
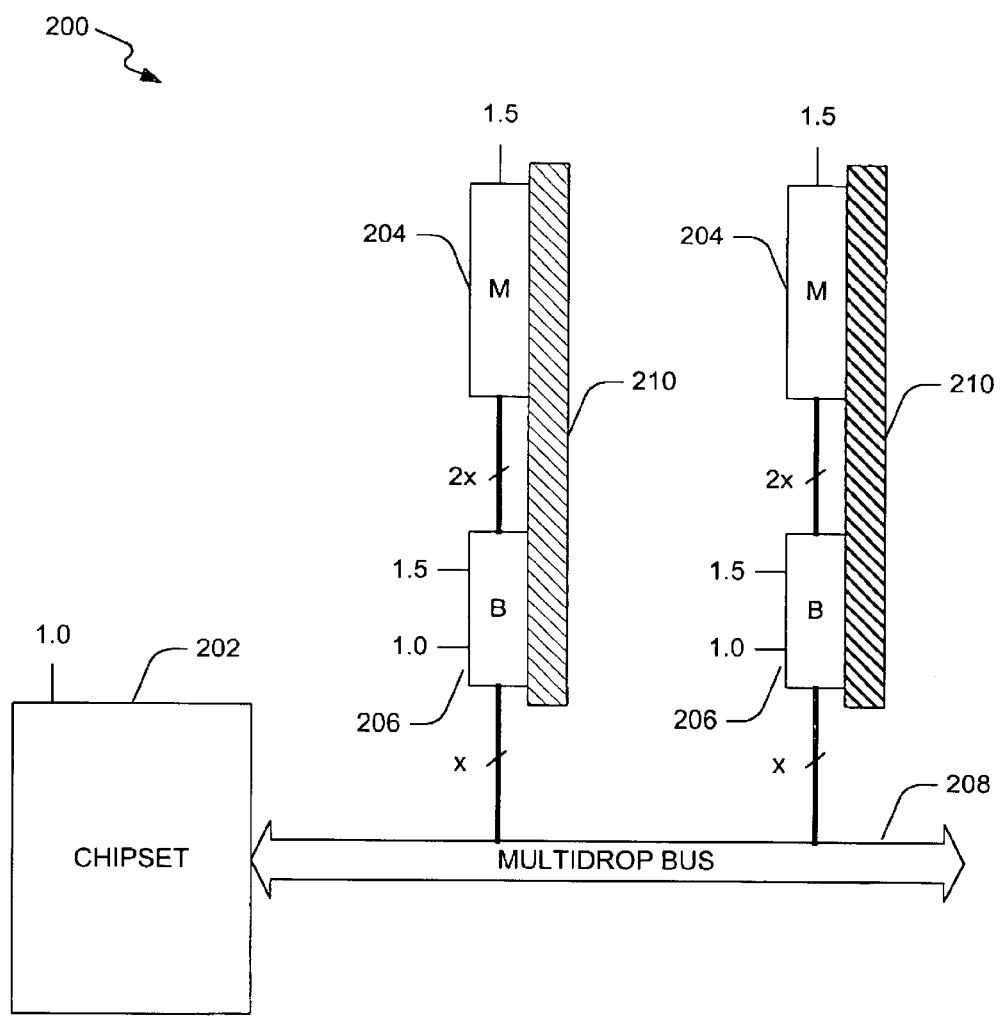
FIG. 2 illustrates an embodiment of an interface having a plurality of data buffers disposed between the chipset and the memory modules.

In the illustrated embodiment 200 of FIG. 2, a plurality of data buffers 206 are disposed in the memory interface between the chipset 202 and the memory modules 204 to provide electrical isolation. For the illustrated embodiment, a multidrop bus 208 provides the interface between the chipset 202 and the data buffers 206. The interface between the chipset 202 and the data buffers 206 may be run at the same data access rate or frequency (ω) as before, but with half the pin count (x) of the prior art design. The interface between the data buffers 206 and the memory modules 204 still has 2×number of pins to provide the same data access rate as before. In practice, x is often selected to be 16 or 32. Moreover, the chipset 202 is configured to operate with only the low voltage (1.0 volt) as shown. The memory modules 204 are operated with only the high voltage (1.5 volts).

In the illustrated embodiment of FIG. 2, the data buffer 206 is provided on the same memory board 210 as the memory module 204. However, the data buffer 206 may be provided on the motherboard containing the chipset 202.

Figure 3:
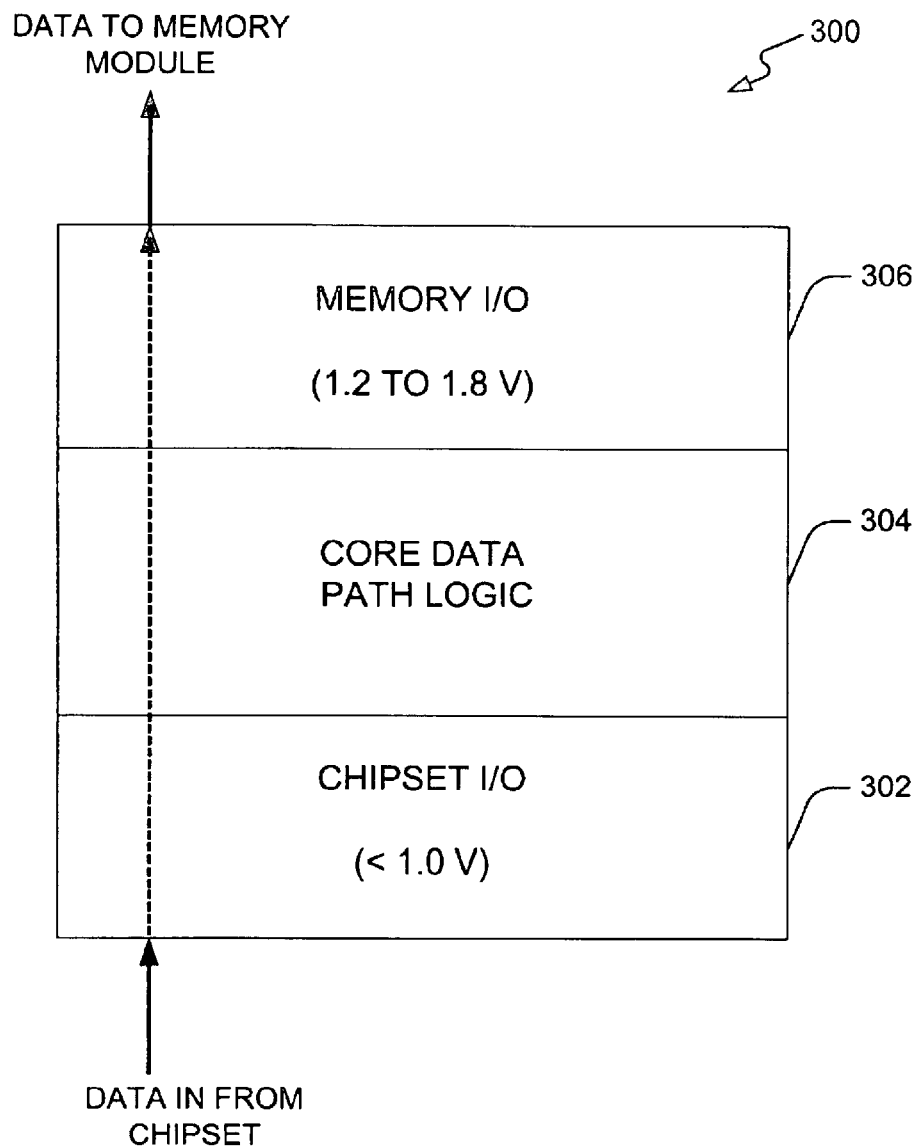
FIG. 3 shows a layout configuration of a data buffer.

FIG. 3 shows a layout configuration of a data buffer is 300, similar to the data buffer 206 of FIG. 2, in accordance with an embodiment of the present disclosure. The data buffer 300 includes three portions 302, 304, 306. The first portion 302 is a chipset input/output (I/O) port configured to send and receive data to and from the chipset through the multidrop bus 208. The first portion 302 operates at the same voltage (<1.0 volts) as the chipset. This allows compatibility of interface between the chipset and the data buffer 300. The second portion 304 is a core data path logic portion allowing for buffering of data between the chipset and the memory module. The third portion 306 is a memory I/O port configured to send and receive data to and from the memory module. The third portion 306 operates at the same nominal voltage as the memory module (between 1.2 and 1.8 volts).

Figure 4:
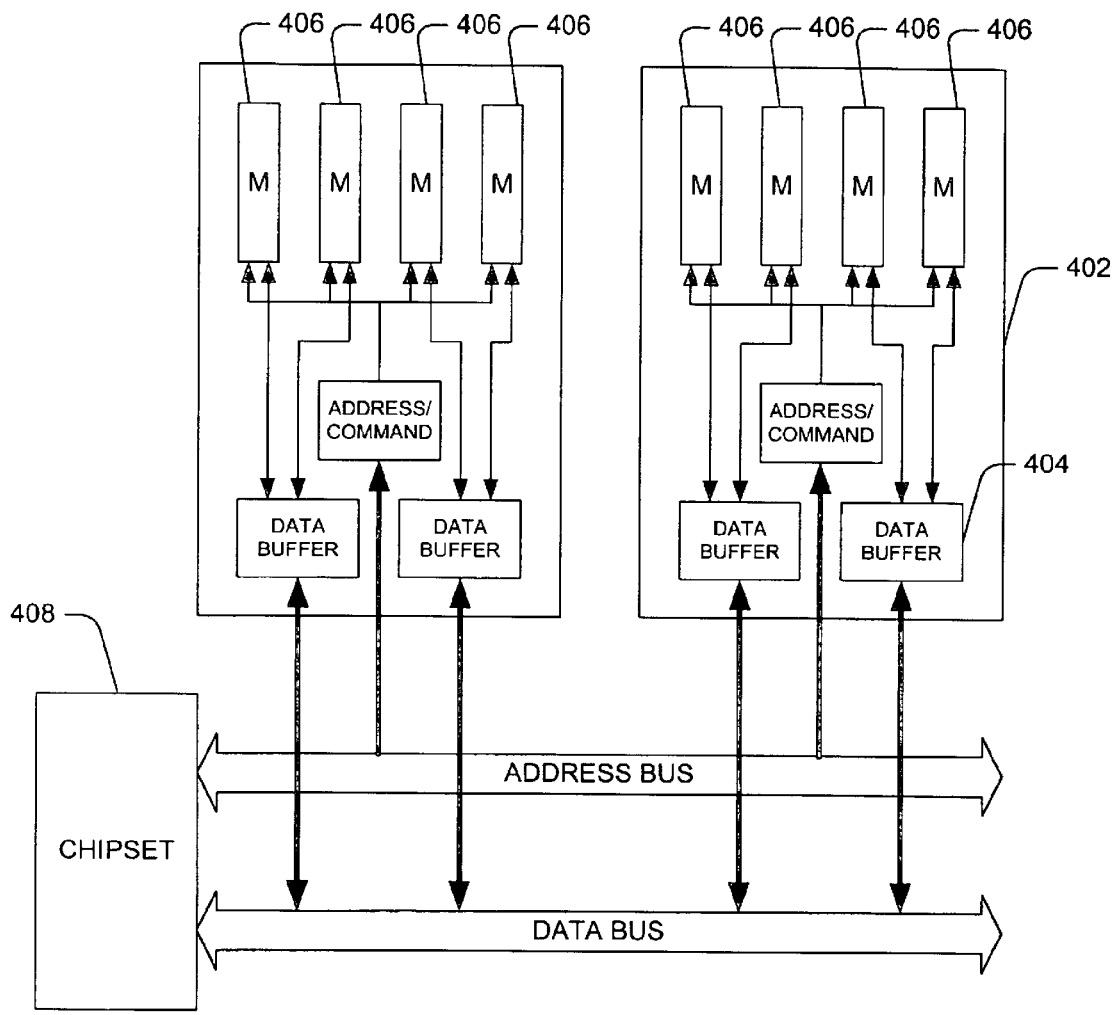
FIG. 4 is a front view of the interface showing the details of memory boards having the memory modules.

FIG. 4 is a front view of the memory interface showing the details of the memory boards 402, and highlighting the connections to the data buffers 404. The front view of the memory interface shows the isolation of the memory modules 406 from the chipset 408. With separation of the address and data bus lines shown, the reduction in the pin count can be ascertained. The memory modules in this and other embodiments may be of any memory types. However, in particular, the memory modules may be dynamic random access memories (DRAM), double data rate (DDR) DRAM, or quad data rate (QDR) DRAM. The quad data rate DRAM may be achieved by providing a pin count of 4×in the second sub-interface between the buffer and the memory module, and operating the first sub-interface between the buffer and the chipset at 4 times the rate of the second sub-interface (see FIG. 2).

Figure 5:
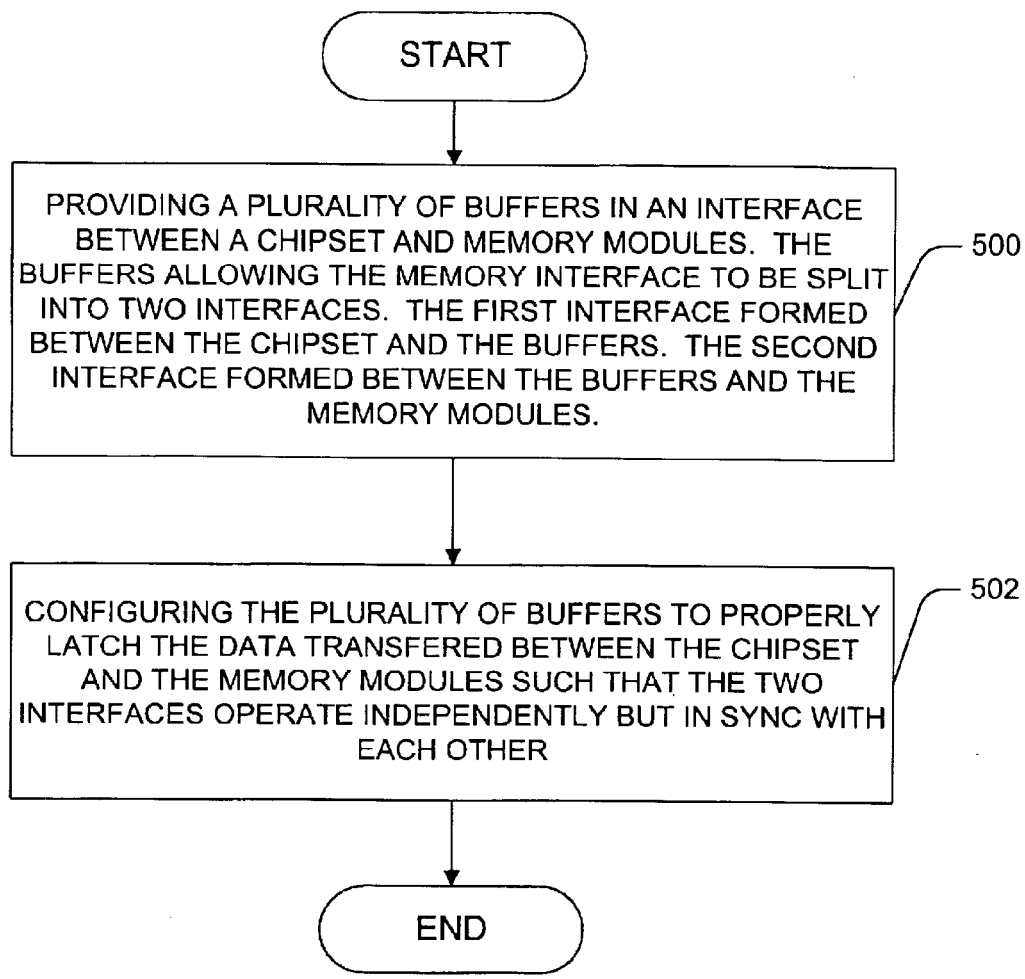
FIG. 5 shows a process for buffering the data passed between the chipset and the memory modules.

FIG. 5 shows a process for buffering the data passed between the chipset and the memory modules to provide isolation of voltages and interfaces. The method includes providing at least one buffer in an interface between a chipset and memory modules at 500. The buffers allow the memory interface to be split into two interfaces. The first interface is between the chipset and the buffers. The second interface is between the buffers and the memory modules. The at least one buffer is then configured to properly latch the data at 502. This allows the first and second interfaces to operate independently but in sync with each other.

While specific embodiments of the invention have been illustrated and described, other embodiments and variations are possible. For example, although the figures show data buffers providing double (i.e. factor =2) the memory data access rate for a particular number of pin counts, the factor may be any feasible number that affords increased data access rate.

All these are intended to be encompassed by the following claims.

What is claimed is:

1. A method, comprising:
   providing at least one buffer in an interface between a chipset and memory modules, said at least one buffer allowing the interface to be split into first and second sub-interfaces, where the first sub-interface is between the chipset and the at least one buffer, and the second sub-interface is between the at least one buffer and the memory modules; and
   configuring said at least one buffer to properly latch the data being transferred between the chipset and the memory modules, such that the first and second sub-interfaces operate independently but in synchronization with each other.

2. The method of claim 1, wherein said providing said at least one buffer isolates the first and second sub-interfaces in such a manner that the first sub-interface is operated at different voltage level than the second sub-interface.

3. The method of claim 2, wherein an operating voltage level of said first sub-interface is less than 1.0 volt.

4. The method of claim 2, wherein an operating voltage level of said second sub-interface is between 1.2 and 1.8 volts.

5. The method of claim 1, wherein said providing said at least one buffer isolates the first and second sub-interfaces in such a manner that the first sub-interface is operated at higher frequency than the second sub-interface.

6. The method of claim 5, wherein said first sub-interface is operated at twice the frequency of the second sub-interface.

7. The method of claim 6, wherein a number of data lines in said first sub-interface is half that of a number of data lines in said second sub-interface.

8. The method of claim 1, wherein said at least one buffer are provided on a same memory board as the memory modules corresponding to said at least one buffer.

9. The method of claim 1, wherein said chipset is provided on a motherboard.

10. The method of claim 1, wherein said interface between the chipset and the memory modules is a multidrop bus.

11. The method of claim 1, wherein each of said memory modules includes dynamic random access memory (DRAM).

12. The method of claim 1, wherein each of said memory modules includes double data rate (DDR) DRAM.

13. The method of claim 1, wherein each of said memory modules includes quad data rate (QDR) DRAM.

14. A method, comprising:
   providing at least one buffer in an interface between a chipset and memory modules, said at least one buffer allowing the interface to be split into first and second sub-interfaces, where the first sub-interface is between the chipset and the at least one buffer, and the second sub-interface is between the at least one buffer and the memory modules, said at least one buffer isolates the first and second sub-interfaces in such a manner that the first sub-interface is operated at different voltage level than the second sub-interface, and the first sub-interface is operated at higher frequency than the second sub-interface; and
   configuring said at least one buffer to properly latch the data being transferred between the chipset and the memory modules, such that the first and second sub-interfaces operate independently but in synchronization with each other.

15. A method, comprising:
   isolating a memory interface between a chipset and memory modules, where said isolating divides the memory interface into first and second sub-interfaces; and
   configuring said first and second sub-interfaces to properly transfer data between the chipset and the memory modules, such that the first and second sub-interfaces operate independently but in synchronization with each other,
   wherein said first and second sub-interfaces are configured in such a manner that the first sub-interface is operated at different voltage level and at higher frequency than the second sub-interface.

16. The method of claim 15, wherein an operating voltage level of said first sub-interface is less than 1.0 volt, and an operating voltage level of said second sub-interface is between 1.2 and 1.8 volts.

17. The method of claim 15, wherein said first sub-interface is operated at twice the frequency of the second sub-interface, and a number of data lines in said first sub-interface is half that of a number of data lines in said second sub-interface.

18. A system, comprising:
   a memory interface between a chipset and at least one memory module; and
   at least one buffer disposed in said memory interface to divide said memory interface into first and second sub-interfaces,
   where said first and second sub-interfaces are configured in such a manner that the first sub-interface is operated at different voltage level and at higher frequency than the second sub-interface.

19. The system of claim 18, wherein an operating voltage level of said first sub-interface is less than 1.0 volt, and an operating voltage level of said second sub-interface is between 1.2 and 1.8 volts.

20. The system of claim 18, wherein said first sub-interface is operated at twice the frequency of the second sub-interface.

21. The system of claim 20, wherein a number of data lines in said first sub-interface is half that of a number of data lines in said second sub-interface.

* * * * *